(12) United States Patent
Nagatomo et al.

(10) Patent No.: US 11,004,916 B2
(45) Date of Patent: May 11, 2021

(54) ORGANIC LIGHT EMITTING DEVICE, IMAGE CAPTURING DEVICE, AND METHOD FOR PRODUCING ORGANIC LIGHT EMITTING DEVICE

(71) Applicant: CANON KABUSHIKI KAISHA, Tokyo (JP)

(72) Inventors: Yasuhiro Nagatomo, Kawasaki (JP); Nobutaka Ukigaya, Oita (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/959,067

(22) Filed: Apr. 20, 2018

(65) Prior Publication Data

US 2018/0315946 A1 Nov. 1, 2018

(30) Foreign Application Priority Data

Apr. 28, 2017 (JP) .............................. JP2017-090409

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 51/5056* (2013.01); *H01L 51/5088* (2013.01); *H01L 51/5203* (2013.01); *H01L 51/5209* (2013.01)

(58) Field of Classification Search
CPC ............. H01L 27/3246; H01L 51/5203; H01L 51/5206; H01L 51/5209
USPC ............ 257/40, 88, 89, E51.018; 438/34, 99
See application file for complete search history.

(56) References Cited

U.S. PATENT DOCUMENTS

| | | | | |
|---|---|---|---|---|
| 2006/0097263 A1* | 5/2006 | Lee | ...................... | H01L 27/3246 257/72 |
| 2008/0068484 A1* | 3/2008 | Nam | .................. | H04N 5/23293 348/333.01 |
| 2012/0248467 A1* | 10/2012 | Yokoyama | .......... | H01L 27/3246 257/88 |
| 2013/0334507 A1* | 12/2013 | Shimoji | .............. | H01L 51/5036 257/40 |
| 2016/0043341 A1* | 2/2016 | Heo | ...................... | H01L 51/5228 257/40 |
| 2019/0006436 A1* | 1/2019 | Gong | .................. | H01L 27/3265 |
| 2019/0043934 A1* | 2/2019 | Ukigaya | .............. | G09G 3/3225 |

FOREIGN PATENT DOCUMENTS

| | | |
|---|---|---|
| JP | 2006-5712 A | 1/2006 |
| JP | 2007-36492 A | 2/2007 |
| JP | 2010-157493 A | 7/2010 |
| JP | 2012-216495 A | 11/2012 |

(Continued)

*Primary Examiner* — Mohammed Shamsuzzaman
*Assistant Examiner* — Aaron J Gray
(74) *Attorney, Agent, or Firm* — Canon U.S.A., Inc., IP Division

(57) ABSTRACT

An organic light emitting device including a first electrode arranged on a first insulation layer, a second insulation layer that covers an end of the first electrode, an organic layer arranged on the first electrode and the second insulation layer and including a light emission layer, and a second electrode arranged on the organic layer, wherein in a cross section including the first insulation layer, the first electrode, and the second insulation layer, the second insulation layer has an eaves shape.

26 Claims, 8 Drawing Sheets

(56) References Cited

FOREIGN PATENT DOCUMENTS

| | | | | |
|---|---|---|---|---|
| JP | 2013-186448 A | | 9/2013 | |
| KR | 2019003240 A | * | 6/2017 | ......... H01L 27/3213 |
| WO | 2012/014252 A1 | | 2/2012 | |

* cited by examiner

ORGANIC LIGHT EMITTING DEVICE, IMAGE CAPTURING DEVICE, AND METHOD FOR PRODUCING ORGANIC LIGHT EMITTING DEVICE

BACKGROUND

Field of the Invention

The present disclosure relates to an organic light emitting device, an image capturing device, and a method for producing the organic light emitting device.

Description of the Related Art

An organic electro-luminescence (EL) display as one example of an organic light emitting device using organic EL is thinner and lighter, and has a wider viewing angle and lower power consumption than a liquid crystal display. In recent years, the organic EL displays having such characteristics have been actively developed.

International Publication WO2012/014252 discusses a configuration in which an insulation layer is formed to cover an end portion of a lower electrode, and an organic layer and an upper electrode are laminated in order on the insulation layer, as a configuration of a pixel area of an organic EL display. The end portion of the lower electrode is covered with the insulation layer, so that an effect including prevention of an event such as a short circuit can be provided.

According to the configuration discussed in International Publication WO2012/014252, in the insulation layer arranged on a lower electrode, at least a part of a portion covering the end portion of the lower electrode is stepped cut. If the insulation layer covering the end portion of the lower electrode is stepped cut, a leakage current may be generated between lower electrodes of adjacent pixels.

SUMMARY OF THE INVENTION

According to an aspect of the present disclosure, an organic light emitting device includes a first electrode arranged on a first insulation layer, a second insulation layer configured to cover an end portion of the first electrode, an organic layer arranged on the first electrode and the second insulation layer and including a light emission layer, and a second electrode arranged on the organic layer, wherein, in a cross section including the first insulation layer, the first electrode, and the second insulation layer, the second insulation layer includes a first portion that covers the end portion of the first electrode, a second portion that is in contact with the first insulation layer, and a third portion that is arranged between the first portion and the second portion, is in contact with the first portion and the second portion, and forms a recessed portion of the second insulation layer, the recessed portion being recessed toward the first electrode.

According to another aspect of the present disclosure, an organic light emitting device includes a first electrode arranged on a surface of a first insulation layer, a second insulation layer configured to cover an end portion of the first electrode, an organic layer arranged on the first electrode and the second insulation layer and including a light emission layer, and a second electrode arranged on the organic layer, wherein, in a cross section including the first insulation layer, the first electrode, and the second insulation layer, the second insulation layer includes a first portion that covers the end portion of the first electrode, a second portion that is in contact with the first insulation layer, and a third portion that is arranged between the first portion and the second portion and is in contact with the first portion and the second portion, and wherein, in the cross section, the first portion protrudes relative to the third portion in a direction parallel to the surface of the first insulation layer.

According to yet another aspect of the present disclosure, a method for producing an organic light emitting device includes forming a first metal layer on a first insulation layer and forming a second metal layer on the first metal layer formed on the first insulation layer, forming a first electrode by etching the first metal layer and the second metal layer, the first electrode being configured in such a way that the second metal layer protrudes relative to the first metal layer in a direction parallel to a surface of the first insulation layer on which the first metal layer is arranged, forming a second insulation layer configured to cover an end portion of the first electrode, forming an organic layer including a light emission layer on the first electrode and the first insulation layer, and forming a second electrode on the organic layer, wherein the second insulation layer is formed in such a way that a film thickness of the second insulation layer on the first electrode in a direction perpendicular to the surface is greater than a length by which the second metal layer protrudes relative to the first metal layer.

Further features will become apparent from the following description of exemplary embodiments with reference to the attached drawings.

DESCRIPTION OF THE EMBODIMENTS

Hereinafter, an organic light emitting device according to each of exemplary embodiments is described with reference to the drawings. The following exemplary embodiments are illustrative only, and numeral values, shapes, materials, components, and arrangement and connection of the components are not limited to those described below.

Figure 1:
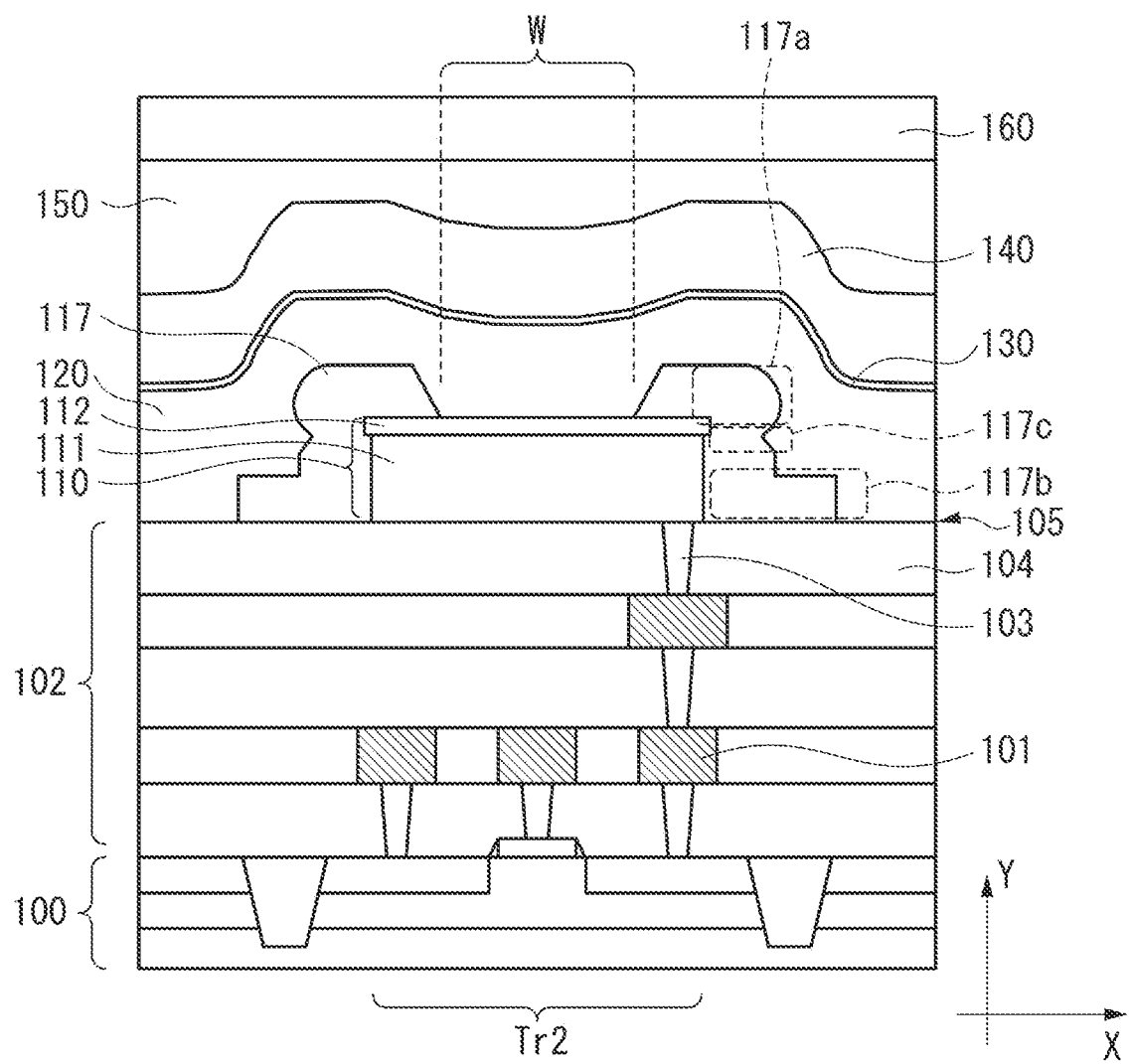
FIG. 1 is a diagram illustrating one example of a section structure of one portion of an organic light emitting device according to a first exemplary embodiment.

FIG. 1 is a schematic diagram illustrating one example of a section structure of a pixel area of an organic electroluminescence (EL) display to which the present exemplary embodiment is applied. In the present exemplary embodiment, an example of a reflective organic light emitting device is described. A scale and an aspect ratio of FIG. 1 are not necessarily accurate.

A pixel illustrated in FIG. 1 includes a substrate 100, a transistor Tr2, a multilayer wiring structure 102, a first electrode 110, an insulation layer 117, an organic layer 120, a second electrode 130, a moisture-proof layer 140, a planarization layer 150, and a color filter 160. For example, a silicon substrate can be used as the substrate 100. In FIG. 1, the multilayer wiring structure 102 includes a plurality of wiring layers 101 and a plurality of plugs 103. Moreover, an organic light emitting element EL includes the first electrode 110, the organic layer 120, and the second electrode 130, and the insulation layer 117 functions as a bank that covers an end portion of the first electrode 110.

Figure 2:
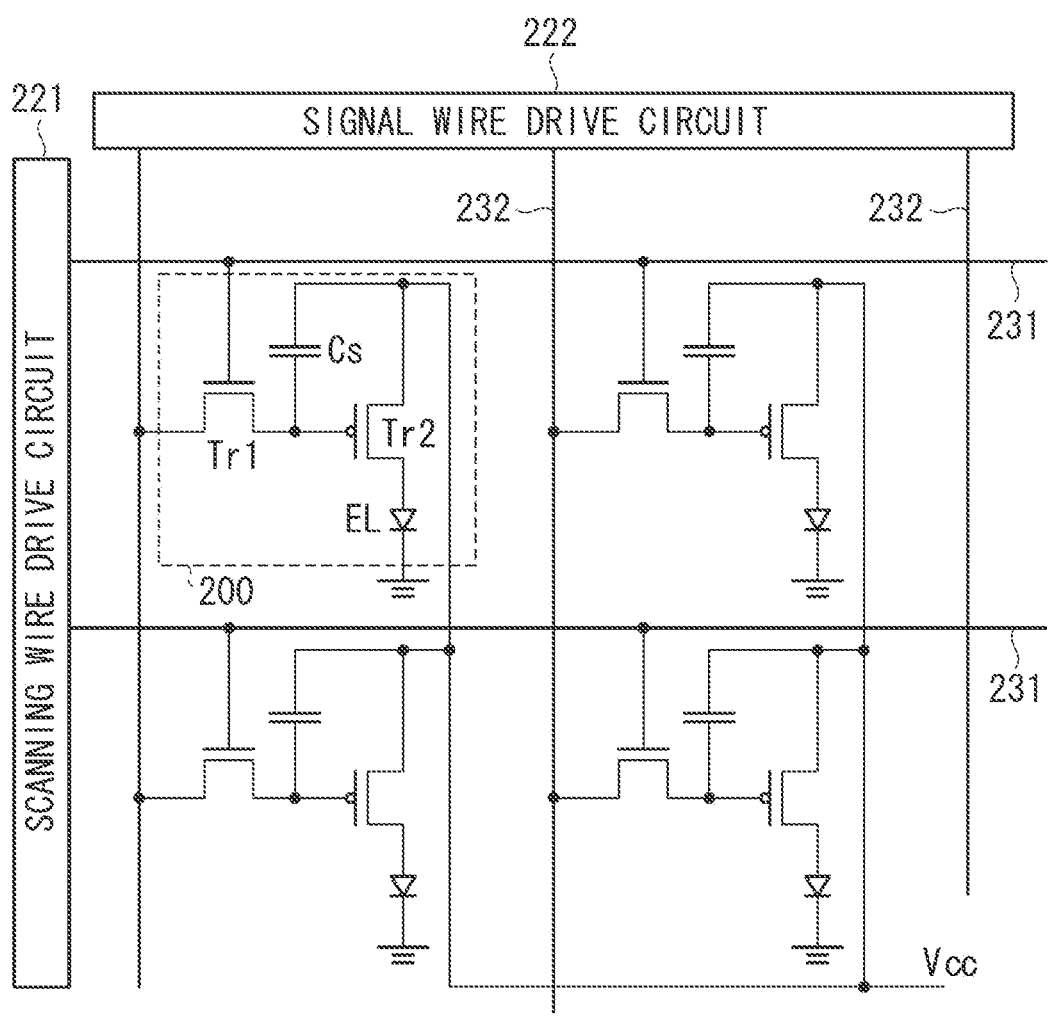
FIG. 2 is an equivalent circuit diagram illustrating one example of one portion of the organic light emitting device according to the first exemplary embodiment.

FIG. 2 is an equivalent circuit diagram illustrating one example of a pixel 200. The organic light emitting device according to the present exemplary embodiment includes a display area including a plurality of pixels 200 arranged in a matrix manner, and a peripheral area arranged on the periphery of the display area. In the peripheral area, a scanning wire drive circuit 221 and a signal wire drive circuit 222 are arranged. The scanning wire drive circuit 221 outputs scanning signals to a plurality of scanning wires 231, whereas the signal wire drive circuit 222 outputs video signals to a plurality of signal wires 232.

Each of the pixels 200 is connected to a scanning wire and a signal wire, and includes a switching transistor Tr1, the drive transistor Tr2, a storage capacitor Cs, and the organic light emitting element EL. Herein, a description is given using an example in which an N-type metal-oxide semiconductor (MOS) transistor is used as the switching transistor Tr1, and a P-type MOS transistor is used as the drive transistor Tr2. However, the transistors Tr1 and Tr2 are not limited thereto.

A gate of the switching transistor Tr1 is connected to the scanning wire 231. One of a source and a drain of the switching transistor Tr1 is connected to the signal wire 232, and the other of the source or the drain is connected to a gate of the drive transistor Tr2 and one electrode of the storage capacitor Cs. The other electrode of the storage capacitor Cs and one of a source and a drain of the drive transistor Tr2 are connected to a power supply line Vcc. The other of the source or the drain of the drive transistor Tr2 is connected to the organic light emitting element EL.

In the organic light emitting device illustrated in FIG. 2, the scanning wire drive circuit 221 shifts the switching transistor Tr1 to an on-state, so that a video signal is written in the pixel 200 from the signal wire 232, and the written video signal is retained by the storage capacitor Cs. An electric current according to the retained video signal is supplied from the drive transistor Tr2 to the organic light emitting element EL, and the organic light emitting element EL emits light with brightness according to the electric current. Herein, an example is illustrated in which the drive transistors Tr2 and the storage capacitors Cs of the plurality of pixels 200 are connected to the common power supply line Vcc.

The above-described configuration of the pixel circuit is one example, and the pixel 200 can further include a capacitor element and a transistor as necessary. Moreover, a peripheral circuit can appropriately include a drive circuit that may be necessary depending on a configuration of a pixel.

In FIG. 1, the multilayer wiring structure 102 including the plurality of wiring layers 101 and a plurality of interlayer insulation layers is formed on the transistor Tr2. The first electrode 110 of the organic light emitting element EL is arranged on the multilayer wiring structure 102. The first electrode 110 is connected to the drive transistor Tr2 via the wiring layer 101 and the plug 103 in the multilayer wiring structure 102. Moreover, a metal-insulator-metal (MIM) capacitor is arranged as a capacitor element Ca in the multilayer wiring structure 102.

The multilayer wiring structure 102 can include a light-shielding layer (not illustrated) so that transistor characteristics are not affected by light from the organic light emitting element EL. For example, aluminum alloy can be used as a material of the wiring layer 101, and tungsten can be used as a material of the plug 103 for connection of the wiring layer 101. Moreover, for example, a film made of silicon oxide can be used for an interlayer insulation film. For example, a material such as titanium (Ti) and titanium nitride (TiN) can be used as a material of the light-shielding layer. In the multilayer wiring structure 102, an inorganic insulation film with a planarized surface is preferably used as an insulation layer 104 to be a base of the first electrode 110 to reduce a variation in film thickness of the first electrode 110. A surface of the insulation layer 104 can have unevenness. In the present exemplary embodiment, a single inorganic insulation film forms the insulation layer 104 as a base of the first electrode 110, the insulation layer 117, and the organic layer 120. In a modification example, a plurality of insulation films or a plurality of insulation members may be combined to form a base.

The multilayer wiring structure 102 and the substrate 100 including the transistors Tr1 and Tr2 are referred to as a circuit substrate. The organic light emitting element EL is arranged on the circuit substrate. Herein, a description is given of the reflective organic light emitting device including the first electrode 110 being a reflective electrode and the second electrode 130 being a light transmitting electrode. In particular, the reflective organic light emitting device employing a top emission method by which light is emitted from a side opposite the circuit substrate of the organic light emitting element EL is described using an example in which light is extracted from an upper side in FIG. 1.

For example, the first electrode 110 functioning as an anode has a lamination structure including a first metal layer 111 and a second metal layer 112 arranged on the first metal layer 111. The first electrode 110 has an island shape in which each pixel is separated. The first electrode 110 can be formed using a material such as aluminum alloy, silver, titanium, chromium, gold, platinum, nickel, copper, molybdenum, and tungsten in consideration of, for example, a light reflectance and a work function. In the present exemplary embodiment, for example, the first metal layer 111 includes aluminum (Al), and the second metal layer 112 includes at least one of titanium, molybdenum, and tantalum.

The present exemplary embodiment is described using an example in which the first electrode 110 has an eaves shape. In the first electrode 110 of the organic light emitting device illustrated in FIG. 1, the second metal layer 112 protrudes relative to the first metal layer 111 along a direction X parallel to an upper surface 105 of the insulation layer 104. With the configuration like this, the first electrode 110 is formed in the eaves shape.

The insulation layer 117 is an insulation member for covering an end portion of the first electrode 110 on a pixel-by-pixel basis, and functions as a bank. The term "end portion of the first electrode 110" used herein represents an outer edge portion on an upper surface of the first electrode 110 and an upper portion on a side surface of the first electrode 110 continuing from the outer edge portion. Accordingly, an electric field is concentrated in the vicinity of the end portion of the first electrode 110, so that a short circuit in the first electrode 110 and the second electrode 130 inside the pixel can be reduced or prevented. Herein, a planar view represents a planar view with respect to the upper surface 105 of the insulation layer 104 in the multilayer wiring structure 102. The upper surface 105 of the insulation layer 104 is the surface on which the first electrode 110 is arranged.

In particular, the insulation layer 117 includes an opening W on the first electrode 110. An opening area in the insulation layer 117 on the first electrode 110 corresponds to a light emission area of the organic light emitting element EL. Carriers are injected into the organic layer 120 via the opening W. The injected carriers are recombined in the organic layer 120, thereby emitting light.

Since the insulation layer 117 as described above is in contact with the organic layer 120, the insulation layer 117 is preferably formed of a material having a low moisture content or a low moisture permeability. For example, the insulation layer 117 can be an inorganic insulation layer. More specifically, the insulation layer 117 can be formed of an inorganic insulation material such as silicon oxide, silicon nitride, and silicon oxy-nitride (SiON). Alternatively, the insulation layer 117 can be formed of an organic material such as acrylic and polyimide.

The organic layer 120 includes a light emission layer, and has a structure in which, for example, a hole injection layer, a hole transport layer, a light emission layer, an electron transport layer, and an electron injection layer are stacked. The structure of the organic layer 120 is not limited thereto. The hole injection layer, the hole transport layer, the electron transport layer, and the electron injection layer may be appropriately provided according to an element design. Each of the hole injection layer, the hole transport layer, the light emission layer, the electron transport layer, and the electron injection layer of the organic layer 120 may be appropriately formed of a known organic material.

The second electrode 130 is a light transmitting electrode. The second electrode 130 can be formed by providing or patterning a conductive film. Moreover, a conductive film can be formed on an entire surface of the light emitting device. In a case where the conductive film is formed on the entire surface, the first electrode 110 performs driving on a pixel-by-pixel basis. The conductive film can be formed of, for example, a transparent electrode material such as indium tin oxide (ITO) and indium zinc oxide (IZO).

An organic light emitting element may be configured to have a cavity structure. In this case, since interference of light is used, a material having light transmittance and reflectivity with respect to light from a light emission layer is used for the second electrode 130. For example, silver-magnesium (Ag—Mg) can be used for the second electrode 130. In a case where silver-magnesium is used for the second electrode 130, light is extracted through the second electrode 130 being a semi-transmittance film. Thus, if a film thickness of the second electrode 130 is excessively large, light absorption is increased. As a result, light extraction efficiency is degraded. On the other hand, if a film thickness of the second electrode 130 is excessively small, light reflectance is lowered. As a result, a resonance effect of the cavity structure described above is reduced. Moreover, as the film is thinner, it is more likely that step-cut is generated. As for a ratio of the number of Ag atoms to the number of Mg atoms, the number of Ag atoms can be equal to or greater than the number of Mg atoms. In particular, Ag:Mg can be from 1:1 to 4:1.

Accordingly, if the second electrode 130 is configured as a semi-transmittance film, a thickness of the second electrode 130 is determined in consideration of transmittance, electrical resistance, and film thickness distribution. A film thickness of the second electrode 130 is preferably within the range of 3 nm to 30 nm. For example, if AgMg is used as a material for the second electrode 130, a transmittance of the second electrode 130 is preferably 60% or more. In this case, a thickness of a metal thin film can be a value within the range of 5 nm and 20 nm. The term "step-cut" represents discontinuation of a portion corresponding to a step. For example, in a case where a member B is formed on a member A having a step, a portion corresponding to the step in the member B is discontinued. Such discontinuation is referred to as a step-cut.

The insulation layer 117 formed to cover an end portion of the first electrode 110 is configured in such a way that a shape of a cross-section of the insulation layer is an eaves shape. Herein, the term "cross section" represents a cross section passing through the insulation layer 104, the first electrode 110, and the insulation layer 117, and indicates the cross section illustrated in FIG. 1. For example, a surface perpendicular to the surface 105 of the insulation layer 104 is one of cross sections passing through the insulation layer 104, the first electrode 110, and the insulation layer 117. In the cross section, the insulation layer 117 includes a first portion 117a that covers an end portion of the first electrode 110, a second portion 117b in contact with the insulation layer 104, and a third portion 117c arranged between the first portion 117a and the second portion 117b. In the cross section, the third portion 117c of the insulation layer 117 is in contact with the first portion 117a and the second portion 117b. In other words, the insulation layer 117 is continuous from the first portion 117a which covers the end portion of the first electrode 110 to the second portion 117b which is in contact with the insulation layer 104 via the third portion 117c. Moreover, in the cross section, the third portion 117c of the insulation layer 117 is recessed toward the first electrode 110. Therefore, the third portion 117c has a recessed portion of the insulation layer 117. The recessed portion is recessed toward the first electrode 110. In other words, the recessed portion toward the first electrode 110 can also be a groove in the third portion 117c.

Figure 3:
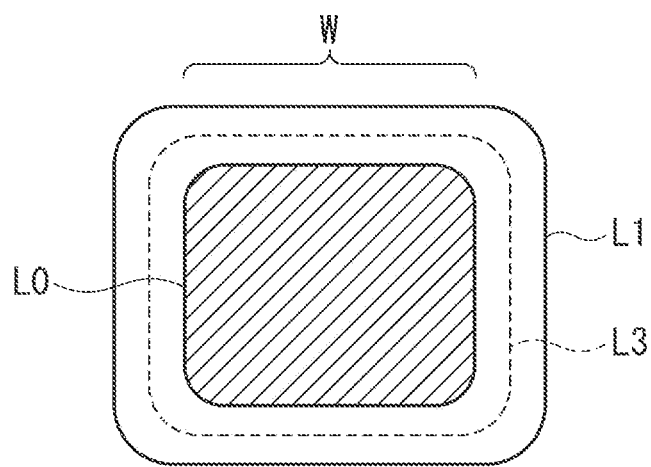
FIG. 3 is a diagram illustrating one example of a section structure of one portion of the organic light emitting device according to the first exemplary embodiment.

Moreover, as illustrated in FIG. 3, in a planar view with respect to the surface 105, an outer edge L3 of the third portion 117c of the insulation layer 117 in the organic light emitting device is arranged inside an outer edge L1 of the first portion 117a of the insulation layer 117. In FIG. 3, the insulation layer 117 has the opening W having the outer edge L1 at a position at which the insulation layer 117 overlaps the first electrode 110 in a planar view. In FIG. 3, an area indicated by slant lines represents the first electrode 110 at a position within the opening W of the insulation layer 117.

The term "eaves shape" used herein is such a shape that includes the aforementioned configuration and in which the insulation layer 117 includes at least the first portion 117a and the third portion 117c in contact with the first portion 117a. Moreover, in comparison with a position of the first portion 117a, a position of the third portion 117c is closer to the insulation layer 104. The first portion 117a, as illustrated in FIG. 1, protrudes from the third portion 117c in a direction X parallel to the surface 105 of the insulation layer 104. Therefore, in the cross section, a distance from a perpendicular with respect to the surface 105 of the insulation layer 104 through an outer edge of the upper surface of the first electrode 110 to a side surface of the first portion 117a is greater than a distance from the perpendicular to the third portion 117c. In another aspect, in the planar view with respect to the surface 105 of the insulation layer 104, a distance from an outer edge of the first portion 117a of the insulation layer 117 to an outer edge of the upper surface of the first electrode 110 is greater than a distance from an outer edge of the third portion 117c of the insulation layer 117 to the outer edge of the upper surface of the first electrode 110.

For example, a side surface of the insulation layer 117 according to the present exemplary embodiment can have a backward tapered shape. Herein, a case in which the side surface of the insulation layer 117 has the backward tapered shape in a cross section indicates that the side surface of the insulation layer 117 has a shape that is inclined toward the inner side of the insulation layer 117 as the side surface of the insulation layer 117 is closer to the insulation layer 104.

The insulation layer 117 having a continuous shape as described above can prevent a leakage current between the first electrode 110 and a first electrode 110 of an adjacent pixel due to contact between the organic layer 120 and the side surface or the end portion of the first electrode 110.

Moreover, between adjacent pixels, there is a possibility that a leakage current may be generated via one portion of the organic layer 120 in a contact portion between the first electrode 110 and the organic layer 120 in the opening W. However, since the insulation layer 117 has the recessed portion as described above, the organic layer 120 arranged on the insulation layer 117 is stepped cut or thinned, so that high resistance can be provided. This can reduce or prevent a leakage current between the first electrodes 110 of adjacent pixels.

As illustrated in FIG. 1, the insulation layer 117 not only has the eaves shape but also has a continuous structure from a portion on an end portion of the first electrode 110 to the second portion 117b, which is in contact with the insulation layer 104, via the first portion 117a and the third portion 117c. In other words, the insulation layer 117 is not stepped cut. For example, the above-described structure can be acquired as follows. The following method is one method for acquiring the structure of the insulation layer 117 illustrated in FIG. 1. Methods other than the method described below can be employed to acquire the structure of the insulation layer 117 illustrated in FIG. 1.

Figure 4A:
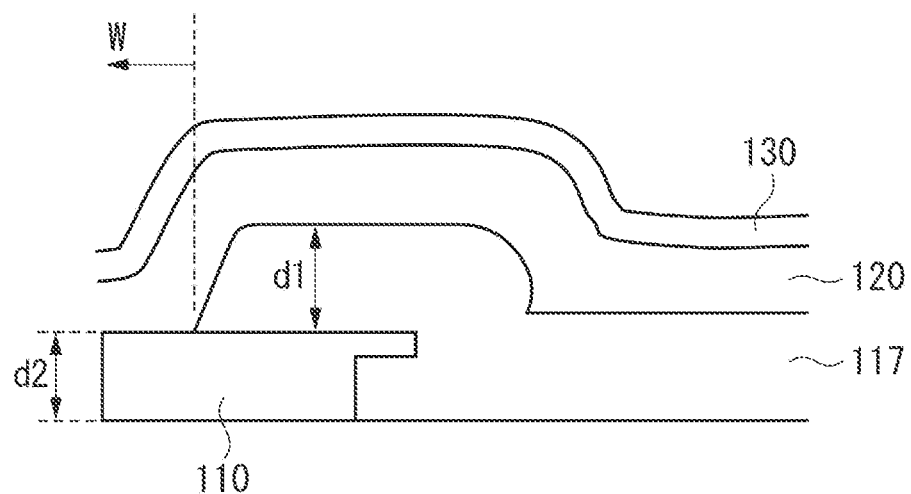
FIGS. 4A and 4B are diagrams each illustrating one example of a planar view of one portion of the organic light emitting device according to the first exemplary embodiment.

For example, as illustrated in FIG. 4A, a film thickness of the insulation layer 117 is greater than that of the first electrode 110, so that the insulation layer 117 can have the eaves shape without being stepped cut. Herein, the term "film thickness" indicates a film thickness in a direction perpendicular to the surface 105 of the insulation layer 104 on which the first electrode 110 is formed. For example, a film thickness d1 of a portion of the insulation layer 117 positioned on the first electrode 110 can be set to be greater than a film thickness d2 of a portion of the first electrode 110 positioned within the opening W in a planar view with respect to the surface 105.

Figure 4B:
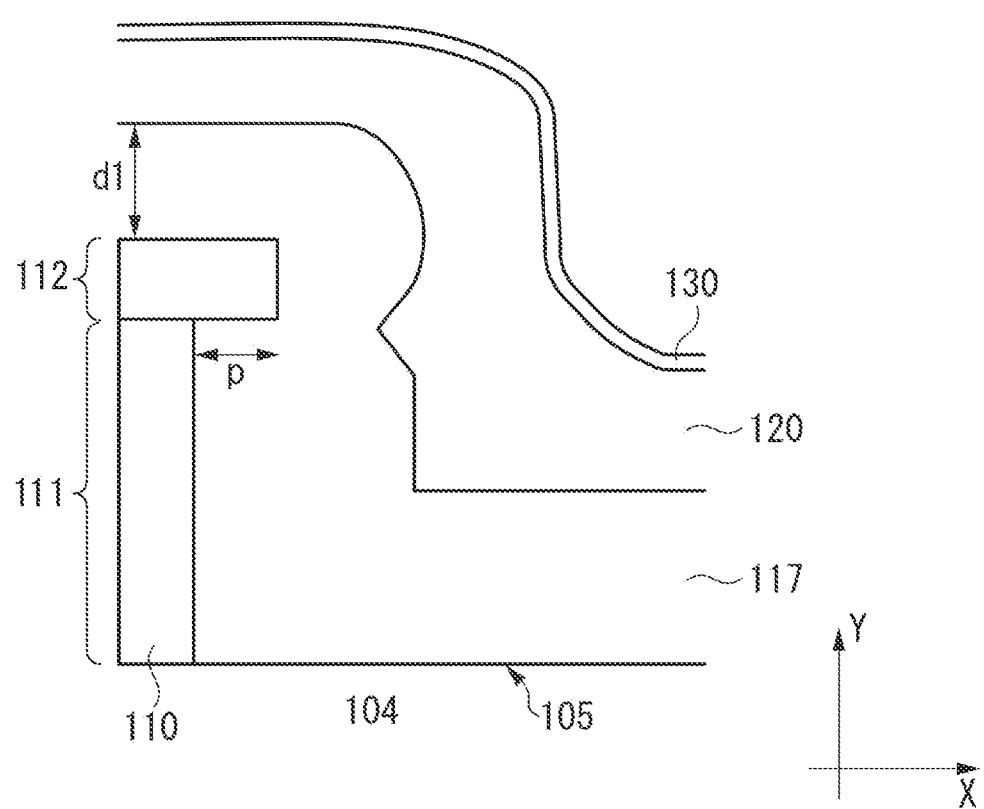

As illustrated in FIG. 4B, the film thickness of the insulation layer 117 is greater than a length p of an eaves-shaped protruding portion of the first electrode 110, so that the insulation layer 117 can be configured to have an eaves shape without being stepped cut. As described above, the first electrode 110 includes the first metal layer 111 and the second metal layer 112 arranged on the first metal layer 111. In the cross-section as illustrated in FIG. 4B, the second metal layer 112 protrudes relative to the first metal layer 111 in a direction parallel to the surface 105 of the insulation layer 104 on which the first electrode 110 is arranged.

Herein, the film thickness d1, on the first electrode 110, in a direction Y perpendicular to the surface 105 of the insulation layer 104 is greater than the length p of a protruding portion of the second metal layer 112 that protrudes relative to the first metal layer 111 in a direction X. This enables the insulation layer 117 to be configured to have an eaves shape without being stepped cut.

In the present exemplary embodiment, the first electrode 110 includes a lamination structure with the first metal layer 111 and the second metal layer 112. However, the first electrode 110 can be formed of one metal layer. In this case, the first electrode 110 includes a first portion that corresponds to the first metal layer 111, and a second portion that is provided on the first portion and corresponds to the second metal layer 112. The second portion protrudes relative to the first portion in a direction parallel to the surface 105 of the insulation layer 104.

A method for forming the insulation layer 117 having the eaves shape includes, for example, forming the first electrode 110 having an eaves shape, forming an insulation film by using a conformal film formation method in such a way that an end portion of the first electrode 110 is covered with the insulation film, and performing etching. Moreover, as for a method for forming the eaves shape in the end portion of the first electrode 110, for example, the first electrode 110 can be formed to have a multilayer structure, and an etching amount difference between side surfaces of respective layers can be used.

In the present exemplary embodiment, the use of an etching rate difference between the first metal layer 111 and the second metal layer 112 enables the second metal layer 112 to protrude. For example, a multilayer film in which a titanium film (the second metal layer 112) is provided on an aluminum film (the first metal layer 111) is formed, and the multilayer film is dry-etched using chlorinated gas to form the first electrode 110 having an island shape in which each pixel is separated. Since chemical etching on aluminum is progressed more easily than that on titanium, the etching on a side surface is progressed more quickly. As a result, a shape of the titanium layer on the aluminum layer projects outward, and in this way, an eaves shape is formed.

By adjusting a condition to be applied at the time of dry etching, a size of the eaves-shaped protruding portion of the first electrode 110 or a tapered angle of a side wall of the end portion of the first electrode 110 can be also adjusted. If the eaves-shaped protruding portion in the end portion of the first electrode 110 is excessively large, the insulation layer 117 to cover the large eaves-shaped protruding portion tends to be stepped cut. On the other hand, if the eaves-shaped protruding portion at the end portion of the first electrode 110 is excessively small, an eaves shape is not formed in the insulation layer 117. Consequently, the aforementioned effects of reduction in the leakage current between the pixels and prevention of the short circuit are not easily achieved.

If the first electrode 110 is formed by laminating metal layers, a size of the eaves shape of the first electrode 110 is determined based on an etching amount difference between side surfaces of the metal layers. For this reason, a flow rate or a pressure of gas to be used for dry etching in a case where the first electrode 110 is formed is adjusted. In this way, ease of formation of a side wall protective film is adjusted, so that an etching amount of the side surface (a side-etching amount) can be adjusted.

An insulation film to serve as the insulation layer 117 is preferably formed by a method capable of conformally forming a film so that the insulation layer 117 which covers the eaves-shaped portion at the end portion of the first electrode 110 is configured to have an eaves shape similar to the shape of the first electrode 110. For example, a silicon oxide film formed by plasma chemical vapor deposition (CVD) using tetraethyl orthosilicate (TEOS) can be used as the insulation film.

Figure 5:
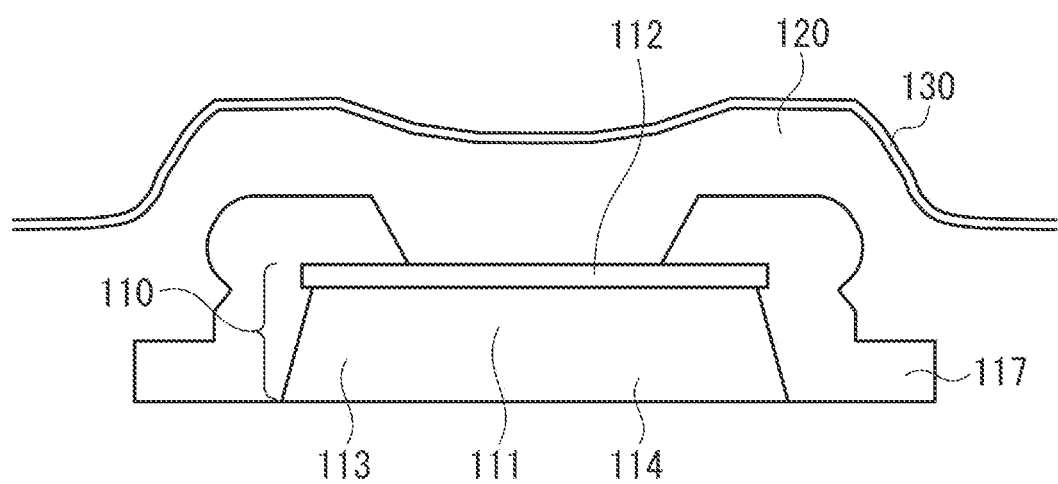
FIG. 5 is a diagram illustrating one example of a section structure of one portion of the organic light emitting device according to the first exemplary embodiment.

If the side wall of the first electrode 110 has a forward tapered shape, the insulation layer 117 tends to be prevented from being stepped cut more easily. In particular, a side surface of the first metal layer 111 preferably has a forward tapered shape. The term "forward tapered shape" indicates that a side surface of the first electrode 110 has a shape that is inclined toward the inner side of the first electrode 110 as the side surface of the first electrode 110 is farther from the insulation layer 104. FIG. 5 illustrates an example of the organic light emitting device in which a side surface of the first electrode 110 has a forward tapered shape in a cross section including the insulation layer 104, the first electrode 110, and the insulation layer 117. In FIG. 5, a description of a portion having a configuration, a material, or a function similar to that of FIG. 1 is omitted.

The first metal layer 111 of the first electrode 110 has a length in a direction (a direction X) parallel to the surface 105 of the insulation layer 104, and the length increases toward the insulation layer 104 from a portion adjacent to the second metal layer 112. For example, the first metal layer 111 includes a portion that is in contact with the insulation layer 104, and an angle formed by a side surface of the portion of the first metal layer 111 and a bottom surface of the first electrode 110 is preferably 80 degrees or less.

Figure 6:
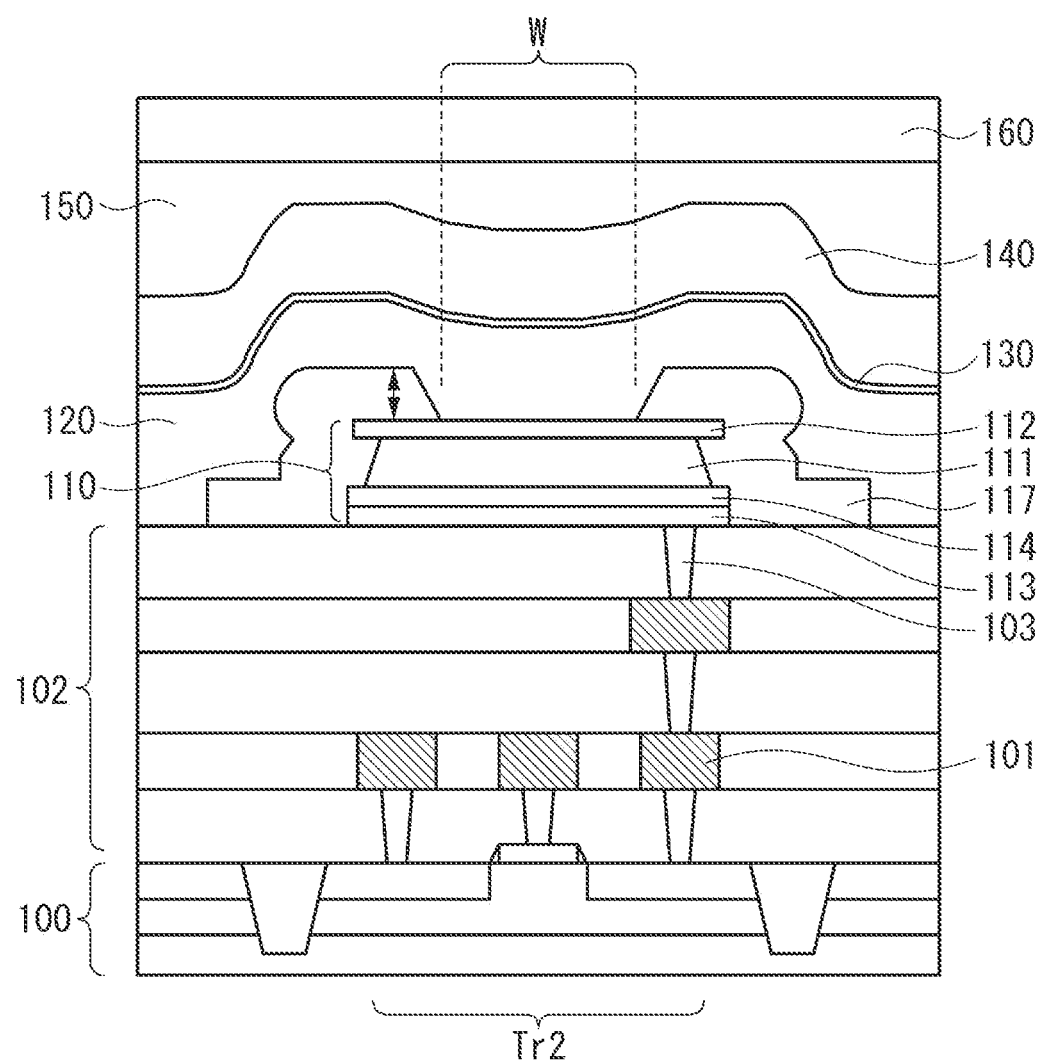
FIG. 6 is a diagram illustrating one example of a section structure of one portion of the organic light emitting device according to the first exemplary embodiment or an organic light emitting device according to a second exemplary embodiment.

FIG. 6 is a sectional view illustrating one example of the organic light emitting device in which the first electrode 110 includes a barrier metal layer and the first metal layer 111 has a tapered shape. The first electrode 110 includes the metal layers 113 and 114 as the barrier metal layers between the insulation layer 104 and the first metal layer 111. The barrier metal layer can include a laminated film with a titanium film as the metal layer 113 and a titanium nitride film as the metal layer 114. As the first electrode 110 includes the barrier metal layer, the surface flatness of the first electrode 110 can be enhanced.

One of the layers in the organic layer 120 may be stepped cut or thinned. The step-cut or film thickness reduction and an effect thereof are described with reference to FIG. 7. According to the present exemplary embodiment, since the insulation layer 117 has the recessed portion (the eaves shape), one of the layers in the organic layer 120 can be stepped cut or thinned.

Figure 7:
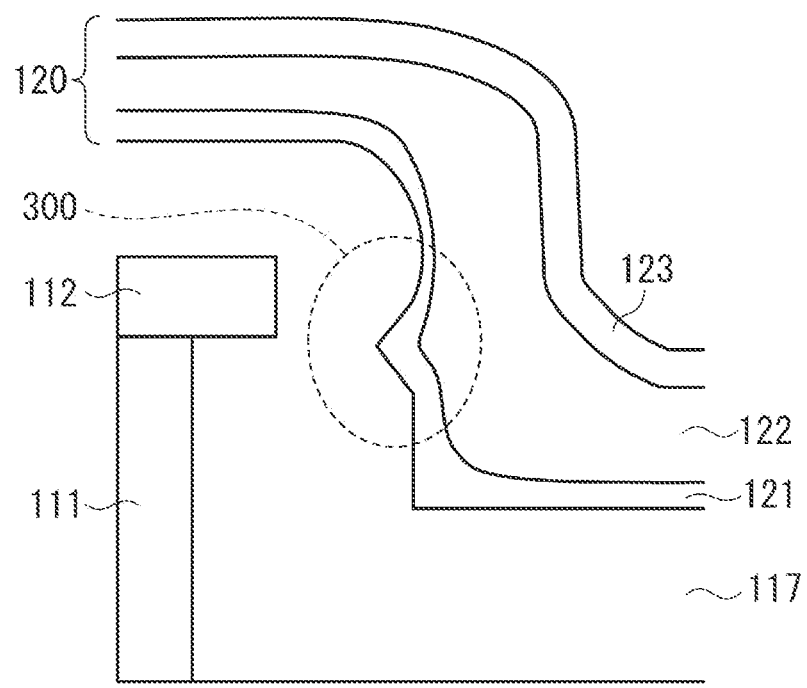
FIG. 7 is a diagram illustrating one example of a section structure of one portion of the organic light emitting device according to the first exemplary embodiment.

In the organic light emitting device illustrated in FIG. 7, the organic layer 120 arranged on the insulation layer 117 has a multilayer structure, and includes a hole transport layer 121, a light emission layer 122, and an electron transport layer 123 that are laminated in order from the first electrode 110 and the insulation layer 117. The insulation layer 117 includes a recessed portion 300 recessed toward the first electrode 110.

In the organic layer 120, the hole transport layer 121 is arranged at a position closest to the insulation layer 104. A film thickness of the hole transport layer 121 in the vicinity of the recessed portion 300 is smaller than film thicknesses of the hole transport layer 121 at positions other than the vicinity of the recessed portion 300. A cause of the reduction in film thickness of the hole transport layer 121 in the vicinity of the recessed portion 300 is that a material does not tend to adhere to a portion to be shadowed in a case where an organic film is formed by a method such as a vapor deposition method. If the protruding portion of the insulation layer 117 is further expanded, the hole transport layer 121 may be stepped cut.

If the hole transport layer 121 is thinned or stepped cut, an electric resistance increases. As a result, a leakage current can be reduced between the first electrode 110 and a first electrode 110 of an adjacent pixel via the hole transport layer 121. Moreover, an electric current flows to the first electrode 110 of the adjacent pixel in a planar view, and light emission can be prevented in an area (an area that is not designed as a light emission area) that does not overlap the first electrode 110.

On the other hand, the second electrode 130 may be a metal thin film (a semi-transmittance film) as described above. In this case, since a film thickness of the second electrode 130 is small, a portion corresponding to a step of the organic layer 120 tends to be stepped cut due to reduction in the film thickness. In a case where the second electrode 130 is a common electrode for a plurality of pixels and has a continuous shape between the pixels as described in the present exemplary embodiment, generation of a step-cut in the second electrode 130 may cause a failure, such as that the organic light emitting element EL which should emit light does not emit light.

The second electrode 130 is more likely to be stepped cut as a step of the organic layer 120 becomes relatively greater or inclination of the step becomes steeper. Accordingly, a height of a step of an upper surface of the organic layer 120 as a base of the second electrode 130 is preferably reduced, or an inclination angle of the upper surface with respect to the surface 105 of the insulation layer 104 is preferably decreased to prevent the second electrode 130 from being stepped cut.

In the present exemplary embodiment, a film thickness of the organic layer 120 is controlled, so that a height of a step of the upper surface of the organic layer 120 can be reduced. In particular, the light emission layer 122 functions as a buffer layer for lessening a step. The use of the light emission layer 122 can reduce a possibility that the second electrode 130 arranged above the light emission layer 122 may be stepped cut while reducing a film thickness of the hole transport layer 121 arranged underneath the light emission layer 122.

In FIG. 7, there is a possibility that the light emission layer 122 may also be influenced by the shape of the insulation layer 117. Accordingly, a film thickness of the light emission layer 122 is set to be greater than a film thickness of the hole transport layer 121, thereby reducing the possibility of generation of a step-cut in the light emission layer 122. Therefore, even if a film thickness of the hole transport layer 121 is reduced, or the hole transport layer 121 is stepped cut, the second electrode 130 to be arranged on the organic layer 120 cannot be stepped cut. For example, a film thickness of the light emission layer 122 can be set to five to fifteen times greater than a film thickness of the hole transport layer 121. Herein, as an example, each of the hole transport layer 121 and the light emission layer 122 is illustrated as a single layer. However, each of the hole transport layer 121 and the light emission layer 122 can be a laminated layer.

The step of the organic layer 120 is caused by a change in film thickness of the organic layer 120 and a shape of the insulation layer 117 or the first electrode 110 to be a base of the organic layer 120. A film thickness of the organic layer 120 is smaller in an area having a step than in a flat area.

If a film thickness of the insulation layer 117 is reduced, a difference in film thickness between the vicinity of the step portion and the flat portion of the organic layer 120 becomes smaller. As a result, the step on the upper surface of the organic layer 120 is lessened, and an inclination angle of the step portion is decreased. Therefore, the use of the organic layer 120 having a film thickness greater than a film thickness of the insulation layer 117 can lessen a step of the insulation layer 117. In particular, for example, a film thickness of the organic layer 120 on the first electrode 110 can be set to be greater than a film thickness of the insulation layer 117 on the first electrode 110. Accordingly, the second electrode 130 to be arranged on the organic layer 120 can be prevented from being stepped cut.

The step of the organic layer 120 may also depend on a film thickness of the first electrode 110. In this case, a thinnest portion of the organic layer 120 is set to have a film thickness greater than a sum of the film thicknesses of the first electrode 110 and the insulation layer 117, so that the step of the organic layer 120 can be lessened. In this way, the second electrode 130 to be arranged on the organic layer 120 can be prevented from being stepped cut.

A film of the organic layer 120 can be formed by, for example, vapor deposition. Moreover, a film of the second electrode 130 can be formed by, for example, vapor deposition.

The organic light emitting device according to the present exemplary embodiment is described using an example case in which the first electrode 110 is a positive electrode and the second electrode 130 is a negative electrode. However, the organic light emitting device is not limited thereto.

If the first electrode 110 is a negative electrode and the second electrode 130 is a positive electrode, the electron transport layer 123, the light emission layer 122, and the hole transport layer 121 can be laminated from a side of the first electrode 110 toward the second electrode 130. Moreover, an electron injection layer may be provided between the first electrode 110 and the electron transport layer 123. Moreover, a hole injection layer may be provided between the second electrode 130 and the hole transport layer 121.

The organic light emitting device according to the present exemplary embodiment has an eaves shape in the cross section including the insulation layer 104 of the multilayer wiring structure 102, the first electrode 110, and the insulation layer 117. In particular, the insulation layer 117 includes the first portion 117a which covers an end portion of the first electrode 110, the second portion 117b which is in contact with the insulation layer 104, and the third portion 117c arranged between the first portion 117a and the second portion 117b. The third portion 117c is in contact with the first portion 117a and the second portion 117b. In other words, the insulation layer 117 is continuous from a portion (the first portion 117a) that covers an end portion of the first electrode 110 to a portion (the second portion 117b) that is in contact with the insulation layer 104.

Therefore, a side surface of the first electrode 110 is in contact with the organic layer 120, thereby preventing generation of a leakage current between the first electrodes 110 of adjacent pixels via the organic layer 120.

In the cross section, the third portion 117c of the insulation layer 117 is recessed toward the first electrode 110. Therefore, one portion of the organic layer 120 arranged on the insulation layer 117 is thinned or stepped cut. Accordingly, in the organic layer 120, a leakage current can be prevented from flowing from a portion in contact with the first electrode 110 within the opening W to the first electrode 110 of an adjacent pixel via the organic layer 120. Moreover, light emission is prevented at a position between the first electrodes 110 of adjacent pixels and not overlapping the first electrode 110 in a planar view.

Since the insulation layer 117 has the eaves shape, there is a possibility that a step to be generated on an upper surface of the organic layer 120 may become higher or larger, or inclination of a side surface shape of the organic layer 120 may become steeper. This may cause the second electrode 130 to be stepped cut. However, an increase in film thickness of the organic layer 120 reduces the possibility of generation of a step-cut in the second electrode 130. Particularly, in the organic light emitting device according to the present exemplary embodiment, since a film thickness of the organic layer 120 is greater than a film thickness of the insulation layer 117, the eaves shape of the insulation layer 117 has a small influence on the upper surface of the organic layer 120. Hence, generation of a step-cut or reduction in film thickness of the second electrode 130 to be arranged on the organic layer 120 can be prevented.

An effect of reduction in leakage current between pixels in the organic light emitting device according to the present exemplary embodiment is described with reference to Table 1. Table 1 illustrates comparison between a leakage current in the organic light emitting device illustrated in FIG. 6 and a leakage current in an organic light emitting device of a comparative example. The organic light emitting device of the comparative example includes an insulation layer 117 with a shape that is changed from that in the organic light emitting device illustrated in FIG. 6.

TABLE 1

|  | Film thickness of insulation layer (nm) | Film thickness of organic layer (nm) | Leakage current (normalization) |
| --- | --- | --- | --- |
| First exemplary embodiment | 65 | 1.0E2 | 0.1 |
| Comparative example | 65 | 1.0E2 | 1.0 |

Similar to the present exemplary embodiment, the organic light emitting device of the comparative example included an insulation layer having a film thickness of 65 nm and an organic layer with a thinnest portion having a film thickness of 100 nm. As illustrated in Table 1, a leakage current between pixels in the organic light emitting device according to the present exemplary embodiment was reduced to approximately one tenth of that in the organic light emitting device of the comparative example. In Table 1, the leakage current indicates a value that is normalized based on the comparative example as 1.

Accordingly, the above-described configuration of the present exemplary embodiment can provide the organic light emitting device in which a leakage current between pixels is reduced.

In the present exemplary embodiment, one example of a method for producing the organic light emitting device is described with reference to FIG. 6.

The drive transistor Tr2 is formed on a silicon substrate as the substrate 100 by a conventional method. An interlayer insulation layer is formed on the drive transistor Tr2, the plug 103 is formed by forming an opening within the interlayer insulation layer, and the wiring layer 101 is formed. Formation of the interlayer insulation layer, the plug 103, and the wiring layer 101 is repeated to form the multilayer wiring structure 102. In the multilayer wiring structure 102, the planarized insulation layer 104 is formed on a topmost wiring layer, and the plug 103 is formed on the planarized insulation layer 104.

On the planarized insulation layer 104, each of metal films to serve as the first metal layer 111, the second metal layer 112, and the barrier metal layers (the metal layers 113 and 114) is laminated by a film formation method such as a sputtering method. For example, a laminated film including a titanium film and a titanium nitride film can be formed as the metal layers 113 and 114 serving as the barrier metal layers. As for the first metal layer 111, for example, an aluminum alloy film (an AlCu film) having a thickness of 50 nm can be formed, and a titanium film to serve as the second metal layer 112 can be formed on the aluminum alloy film. The second metal layer 112 as the topmost surface has a thickness of 10 nm.

Side etching to be performed when the first electrode 110 is divided for each pixel by dry etching is used to form the second metal layer 112 including a titanium layer in an eaves shape protruding by approximately 10 nm relative to the first metal layer 111 including the AlCu layer. Accordingly, the use of an etching rate difference between the first metal layer 111 and the second metal layer 112 can form the first electrode 110 in which the second metal layer 112 has a protruding portion protruding in a direction parallel of the surface 105 of the insulation layer 104 relative to the first metal layer 111.

On the first electrode 110, for example, a silicon oxide film is formed by a plasma CVD method using TEOS as a raw material, and one portion of the silicon oxide film is removed by dry etching, thereby forming the insulation layer 117. Herein, the silicon oxide film is formed in such a way that a thickness of the silicon oxide film in a direction perpendicular to the surface 105 of the insulation layer 104 is greater than a protrusion length of a protruding portion of the second metal layer 112 from the first metal layer 111. Alternatively, the silicon oxide film is formed in such a way that a thickness of the silicon oxide film in a direction perpendicular to the surface 105 of the insulation layer 104 is greater than a sum of film thicknesses of the metal layers 113, 114, 111, and 112. In this way, the silicon oxide film is formed. Thus, the silicon oxide film includes the first portion 117a which not only covers an end portion of the first electrode 110 without being discontinued halfway but also protrudes in a direction similar to the direction in which the protruding portion of the first electrode 110 protrudes.

In a case where dry etching is performed, a portion of the insulation layer 117 overlapping the first electrode 110, in the planar view with respect to the surface 105 of the insulation layer 104 on which the first electrode 110 is to be arranged, is removed. As a result, the opening W is formed in the insulation layer 117. On the first electrode 110, the insulation layer 117 has a portion with a nearly uniform film thickness throughout, and the portion has a film thickness of 65 nm. The insulation layer 117 has an eaves shape, on which the shape of the first electrode 110 is reflected.

Next, the organic layer 120 is formed on the multilayer wiring structure 102, the first electrode 110, and the insulation layer 117 by, for example, a vacuum deposition method. The organic layer 120 includes a light emission layer. Moreover, the organic layer 120 can include at least one of a hole injection layer, a hole transport layer, an electron transport layer, and an electron injection layer. An area, such as an electrode pad area and a scribe area (not illustrated), in which the organic layer 120 is not intended to be formed can be covered with a mask such as a metal mask. The thinnest portion of the organic layer 120 has a film thickness of approximately 100 nm.

After the organic layer 120 is formed, the second electrode 130 formed of a thin film (e.g., a film thickness of approximately 10 nm) made of AgMg is formed by, for example, a vapor deposition method. In the organic light emitting device according to the present exemplary embodiment, although the first electrodes 110 are separately formed on a pixel-by-pixel basis, the second electrode 130 is formed as a common electrode for a plurality of pixels (in a continuous manner).

Formation of the insulation layer 117 in the eaves shape reduces a thickness of one portion of the organic layer 120 formed on the insulation layer 117. Particularly, a thickness of the hole transport layer which is the closest to the insulation layer tends to be reduced. As a result, an electric resistance increases, and thus a leak current between pixels can be reduced.

Next, the moisture-proof layer 140 is formed by a method such as a CVD method and an atomic layer deposition (ALD) method. The moisture-proof layer 140 can have a single layer structure made of a same material, or a lamination structure with layers made of different materials or having different film quality to enhance moisture-proof performance. The moisture-proof layer 140 can be formed using, for example, silicon nitride (SiN).

Subsequently, for example, an insulation film functioning as the planarization layer 150 is formed on the moisture-proof layer 140. After unevenness on the surface of the moisture-proof layer 140 is planarized, the color filter 160 can be formed. Next, the moisture-proof layer 140 is removed by photolithography and a dry-etching method, so that the electrode pad area (not illustrated) is exposed. In this way, the organic light emitting device can be formed.

Figure 8:
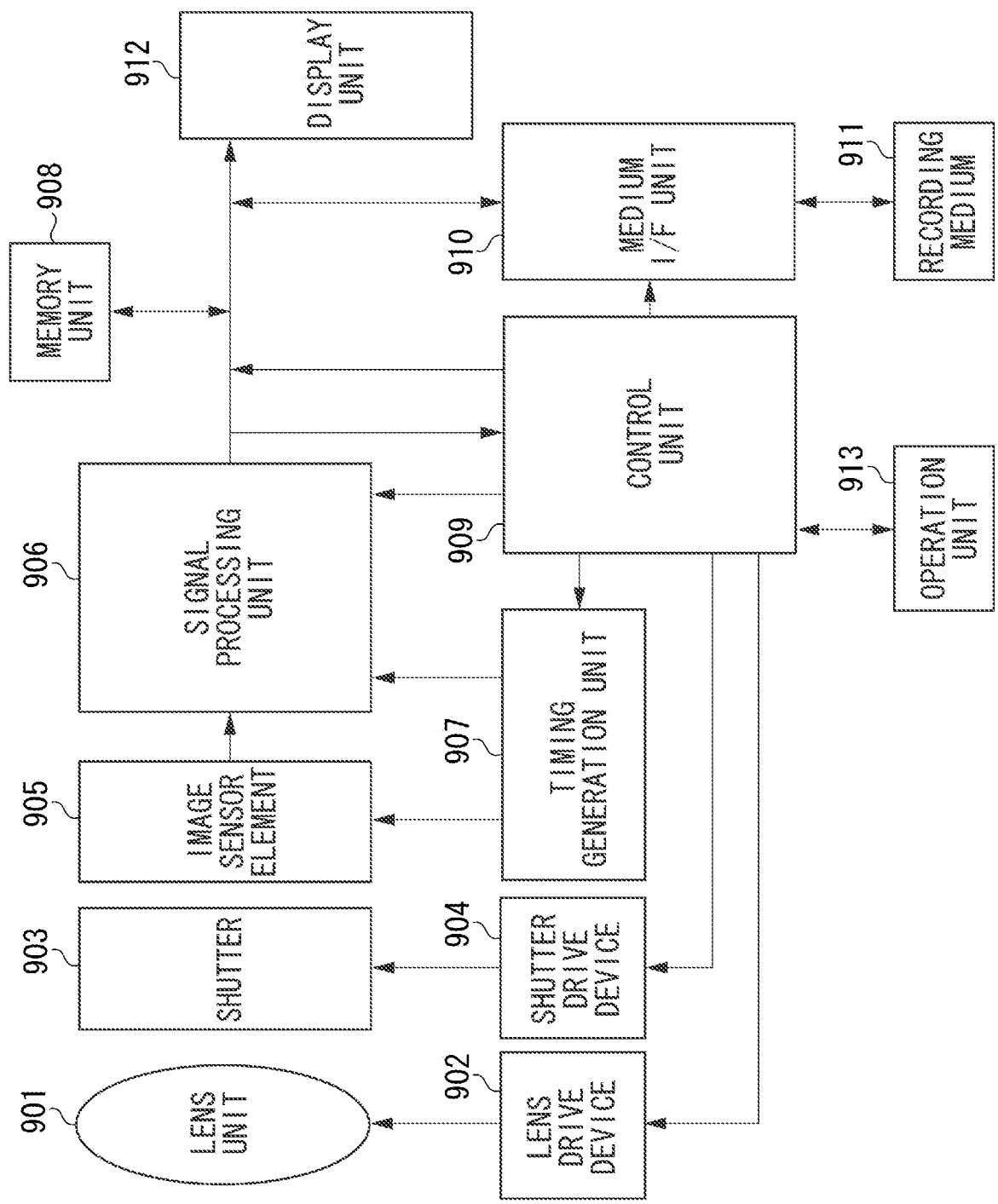
FIG. 8 is a sectional view illustrating one example of electronic equipment according to a third exemplary embodiment.

Next, an example case in which the organic light emitting device according to the first or second exemplary embodiment is applied to electronic equipment is described with reference to FIG. 8.

An exemplary embodiment in which the above-described organic light emitting device is applied to a digital camera is described with reference to FIG. 8. A lens unit 901 is an imaging optical system for forming an optical image of a subject on an image sensor element 905. The lens unit 901 includes a focus lens, a variable magnification lens, and a diaphragm. A control unit 909 controls a position of the focus lens, a position of the variable magnification lens, and an aperture diameter of the diaphragm of the lens unit 901 via a lens drive device 902.

A mechanical shutter 903 is arranged between the lens unit 901 and the image sensor element 905. The control unit 909 controls drive of the mechanical shutter 903 via a shutter drive unit 904. The image sensor element 905 is arranged in such a way that light from a lens is incident on the image sensor element 905, and converts the optical image formed by the lens unit 901 into image signals by a plurality of pixels.

A signal processing unit 906 receives the image signals output from the image sensor element 905, and performs a process such as an analog-digital (AD) conversion process, a demosaic process, a white balance adjustment process, and a coding process, on the image signals. Moreover, the signal processing unit 906 performs a focus detection process for detecting a defocus amount and a direction by using a phase difference detecting method based on a signal acquired from the image signals output from the image sensor element 905.

A timing generation unit 907 outputs various timing signals to the image sensor element 905 and the signal processing unit 906. The control unit 909 includes, for example, a memory (a read only memory (ROM), a random access memory (RAM)) and a microprocessor (a central processing unit (CPU)). The control unit 909 loads a program stored in the ROM into the RAM, and the CPU executes the program to control each unit, thereby providing various functions of the digital camera. The functions to be provided by the control unit 909 include an automatic focus (AF) detection function and an automatic exposure (AE) control function. The control unit 909 receives a signal based on the signal output from the image sensor element 905. Moreover, the control unit 909 inputs a signal for an electronic viewfinder to a display unit 912.

A memory unit 908 is used to temporarily store image data and as a working area by the control unit 909 and the signal processing unit 906. A medium interface (I/F) unit 910 is an interface for reading and writing information and/or data from and to a recording medium 911 as a detachable memory card, for example. The display unit 912 is used to display a captured image and various information about the digital camera. An operation unit 913 is a user interface such as a power switch, a release button, and a menu button. The operation unit 913 is used by a user to make a setting and issue an instruction to the digital camera.

The use of the organic light emitting device according to the first or second exemplary embodiment in the display unit 912 can prevent an increase in power consumption and enhance an emission rate of the display unit 912. Therefore, visibility of an image displayed on the display unit 912 can be improved even in a bright place.

Operations of the digital camera at the time of image capturing are described. When the digital camera is turned on, the digital camera shifts into an image capturing standby state. The control unit 909 starts a moving image capturing process and a display process to cause the display unit 912 to operate as an electronic viewfinder. If an image capturing preparation instruction is input (e.g., if a release button of the operation unit 913 is pressed halfway down) in the image capturing standby state, the control unit 909 starts a focus detection process. For example, the control unit 909 can perform a focus detection process by using a phase difference detecting method. In particular, the control unit 909 determines an image misalignment amount based on a phase difference of signal waveforms obtained by combining together the A image signals of the same type and the B image signals of the same type acquired from a plurality of pixels, and acquires a defocus amount and a direction.

Then, the control unit 909 determines a movement amount and a movement direction of a focus lens of the lens unit 901 from the acquired defocus amount and the acquired direction, and drives the focus lens via the lens drive device 902 to adjust a focus of the imaging optical system. After driving the focus lens, the control unit 909 may further perform the focus detection process based on a contrast evaluation value as necessary to make a fine adjustment of the focus lens position.

Thereafter, when an image capturing start instruction is input (e.g., the release button is pressed all the way down), the control unit 909 executes an image capturing operation for recording, processes acquired image data by using the signal processing unit 906, and stores the processed image data in the memory unit 908. Subsequently, the control unit 909 records the image data stored in the memory unit 908 in the recording medium 911 via the medium I/F unit 910. The image data may be output from an external I/F unit (not illustrated) to an external device such as a computer.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-090409, filed Apr. 28, 2017, which is hereby incorporated by reference herein in its entirety.

What is claimed is:

1. An organic light emitting deice comprising:
   a first electrode arranged on a surface of a first insulation layer;
   a second insulation layer configured to cover a top edge of the first electrode;
   an organic layer, a first portion of the organic layer being arranged on the first electrode and the second insulation layer and including a light emission layer; and
   a second electrode arranged on the organic layer,
   wherein, in a cross section including the first insulation layer, the first electrode, and the second insulation layer, the second insulation layer includes a first portion that covers the top edge of the first electrode, a second portion that is in contact with the first insulation layer, and a third portion that is arranged between the first portion and the second portion in a first direction perpendicular to the surface of the first insulation layer,
   wherein the third portion is in contact with the first portion and the second portion, wherein a side surface of the third portion has a recessed portion of the second insulation layer, the recessed portion being recessed toward the first electrode in a second direction paralleled to the surface of the first insulation layer,
   wherein the recessed portion is located between a second portion of the organic layer and the first electrode in the second direction, the organic layer extending continuously from the first portion to the second portion.

2. The organic light emitting device according to claim 1, wherein, in a planar view with respect to a surface parallel to the surface of the first insulation layer, the third portion of the second insulation layer has an outer edge arranged inside an outer edge of the first portion.

3. The organic light emitting device according to claim 1, wherein the first electrode includes a first metal layer and a second metal layer arranged on the first metal layer, and
   wherein, in the cross section, the second metal layer protrudes relative to the first metal layer in the second direction.

4. The organic light emitting device according to claim 3, wherein, on the first electrode, the second insulation layer has a film thickness in the first direction, the film thickness being greater than a length of a protrusion of the second metal layer protruding relative to the first metal layer in the second direction.

5. The organic light emitting device according to claim 3, wherein, on the first electrode, the second insulation layer has a film thickness in the first direction, the film thickness being greater than a film thickness of a portion of the first electrode in contact with the organic layer in the second direction.

6. The organic light emitting device according to claim 3, wherein the third portion of the second insulation layer is in contact with the first metal layer of the first electrode.

7. The organic light emitting device according to claim 3, wherein, in the cross section, the first metal layer has a length in the second direction, the length being increased toward the first insulation layer from the second metal layer.

8. The organic light emitting device according to claim 3, wherein the first metal layer includes a portion in contact with the first insulation layer, and an angle formed by a side surface of the portion of the first metal layer and a bottom surface of the first electrode is 80 degrees or less.

9. The organic light emitting device according to claim 1, wherein the organic layer includes a hole injection layer between the first electrode and the light emission layer.

10. The organic light emitting device according to claim 1, wherein the first electrode includes a first metal layer and a second metal layer arranged on the first metal layer.

11. The organic light emitting device according to claim 10,
wherein the first metal layer includes aluminum, and
wherein the second metal layer includes any one of titanium, molybdenum, and tungsten.

12. An image capturing device comprising:
an image sensor element on which light is incident;
a control unit to which an output from the image sensor element is input; and
the organic light emitting device according to claim 1, the organic light emitting device being configured to receive a signal from the control unit.

13. The organic light emitting device according to claim 1, wherein the recessed portion comprises at least two sides inclined to the first insulation layer.

14. The organic light emitting device according to claim 1, wherein the organic layer on the first electrode has a film thickness that is greater than a film thickness of the second insulation layer on the first electrode.

15. The organic light emitting device according to claim 14, wherein the organic layer fills the recess.

16. The organic light emitting device according to claim 1, further comprising another organic light emitting device next to the organic light emitting device,
wherein the other organic light emitting device comprises:
a first electrode;
an organic layer arranged on the first electrode; and
a second electrode arranged on the organic layer, and
wherein the organic layer of the other organic light emitting device is continuous with the organic layer of the organic light emitting device.

17. An organic light emitting device comprising:
a first electrode arranged on a surface of a first insulation layer;
a second insulation layer configured to cover an end portion of the first electrode;
an organic layer, a first portion of the organic layer being arranged on the first electrode and the second insulation layer and including a light emission layer; and
a second electrode arranged on the organic layer,
wherein, in a cross section including the first insulation layer, the first electrode, and the second insulation layer, the second insulation layer includes a first portion that covers the end portion of the first electrode, a second portion that is in contact with the first insulation layer, and a third portion that is arranged between the first portion and the second portion in a first direction perpendicular to the surface of the first insulation layer,
wherein the third portion is in contact with the first portion and the second portion,
wherein, in the cross section, the first portion protrudes relative to the third portion from the first electrode to the organic layer in a second direction parallel to the surface of the first insulation layer, and
wherein the third portion is located between a second portion of the organic layer and the first electrode in the second direction, the organic layer extending continuously from the first portion to the second portion.

18. The organic light emitting device according to claim 17, further comprising another organic light emitting device next to the organic light emitting device, wherein the other organic light emitting device comprises: a first electrode; an Organic layer arranged on the first electrode; and a second electrode arranged on the organic layer, and wherein the organic layer of the other organic light emitting device is continuous with the organic layer of the organic light emitting device.

19. The organic light emitting device according to claim 17, wherein, in a planar view with respect to a surface parallel to the surface of the first insulation layer, the third portion of the second insulation layer has an outer edge arranged inside an outer edge of the first portion.

20. The organic light emitting device according to claim 17,
wherein the first electrode includes a first metal layer and a second metal layer arranged on the first metal layer, and
wherein, in the cross section, the second metal layer protrudes relative to the first metal layer in the second direction.

21. The organic light emitting device according to claim 20, wherein, on the first electrode, the second insulation layer has a film thickness in the first direction, the film thickness being greater than a length of a protrusion of the second metal layer protruding relative to the first metal layer in the second direction.

22. The organic light emitting device according to claim 20, wherein the third portion of the second insulation layer is in contact with the first metal layer of the first electrode.

23. The organic light emitting device according to claim 20, wherein, in the cross section, the first metal layer has a length in the second direction, the length being increased toward the first insulation layer from the second metal layer.

24. An image capturing device comprising:
an image sensor element on which light is incident;
a control unit to which an output from the image sensor element is input; and
the organic light emitting device according to claim 17, the organic light emitting device being configured to receive a signal from the control unit.

25. The organic light emitting device according to claim 17, wherein the organic layer on the first electrode has a film thickness that is greater than a film thickness of the second insulation layer on the first electrode.

26. The organic light emitting device according to claim 17, wherein the organic layer fills a recess in the third portion of the second insulation layer.

* * * * *